United States Patent [19]

Wolk

[11] 4,092,593
[45] May 30, 1978

[54] CIRCUIT BOARD TESTING MACHINE

[75] Inventor: Hermann Wolk, Berlin, Germany

[73] Assignee: Siemens Aktiengesellschaft, Berlin & Munich, Germany

[21] Appl. No.: 793,136

[22] Filed: May 2, 1977

[30] Foreign Application Priority Data

Jun. 24, 1976 Germany ..................2628428

[51] Int. Cl.² ............................................. G01R 31/02
[52] U.S. Cl. ............................ 324/158 F; 324/73 PC
[58] Field of Search ............ 324/158 F, 158 P, 158 R, 324/73 PC, 73 AT, 51

[56] References Cited

U.S. PATENT DOCUMENTS

| 3,437,929 | 4/1969 | Glenn | 324/158 R |
|---|---|---|---|
| 3,590,372 | 6/1971 | DeSantis et al. | 324/158 F |

Primary Examiner—Rudolph V. Rolinec
Assistant Examiner—Ernest F. Karlsen
Attorney, Agent, or Firm—Hill Gross, Simpson, Van Santen, Steadman, Chiara & Simpson

[57] ABSTRACT

A circuit board testing machine for positioning one or more test probes relative to a circuit board and wherein the position of the test probes can be automatically positioned and locked in the desired position and in which the circuit board can be replaced in a holder that is automatically moveable against the test probes so as to supply test signals to a measuring device.

10 Claims, 3 Drawing Figures

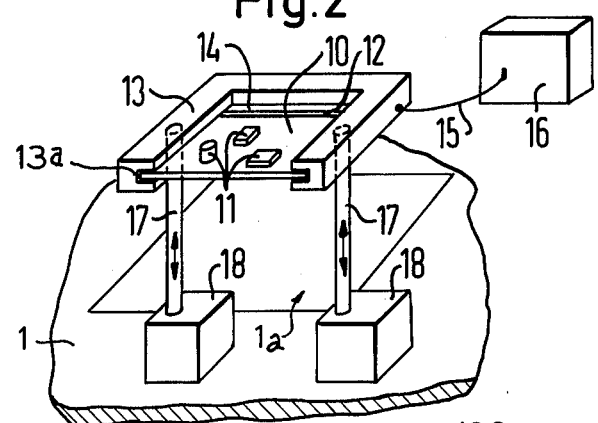
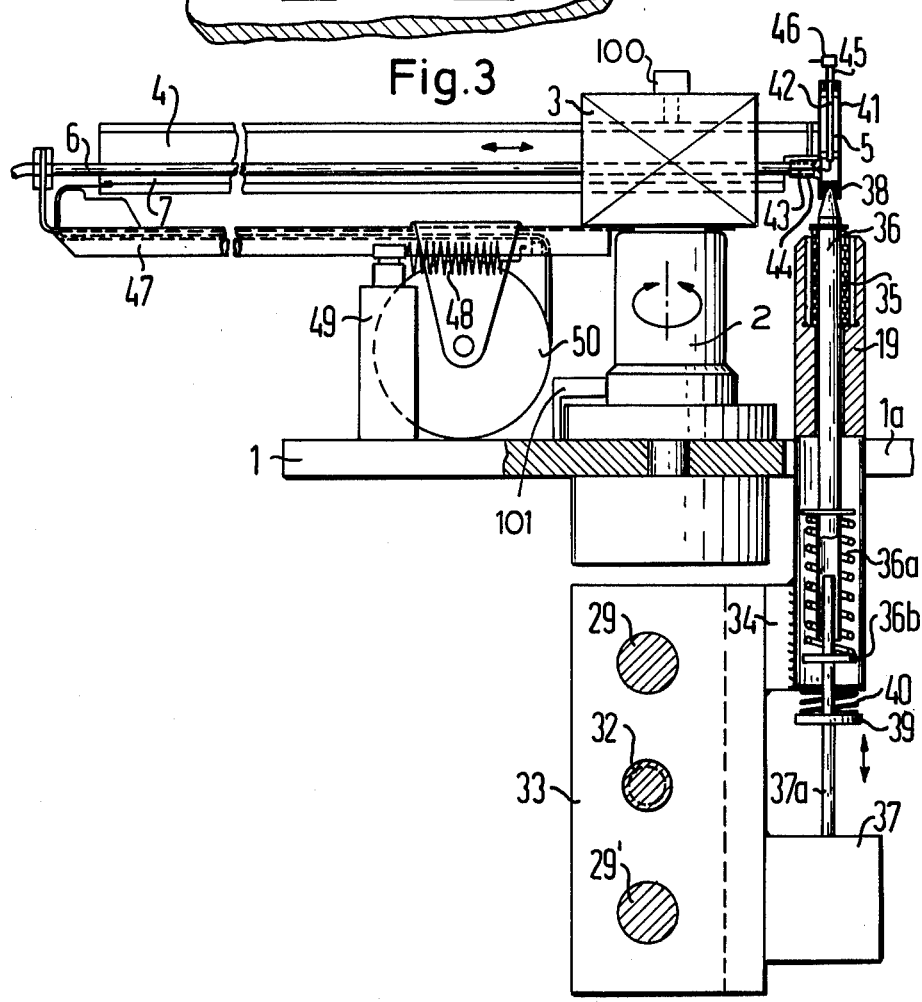

CIRCUIT BOARD TESTING MACHINE

BACKGROUND OF THE INVENTION

1. Field of the Invention

This invention relates in general to a circuit board testing machine for connecting a plurality of terminals and are test points to a circuit board mounted on a support to allow measuring of electrical parameters through the test pins.

2. Description of the Prior Art

Testing meahcines such as disclosed in German OS 2,427,118 are known. This machine consists of a base and a plurality of slide-in units which may be interchanged with each other and which have sides which are freely accessible in the inserted state and the test pins are arranged. The test pins are connected to plug-in connecting elements in the end walls of the slide-in units and are electrically connected through counter-contacts in the machine to the supply lines of measuring circuits. In this arrangement, the test pins are mounted on the individual slide-in units such that they are properly arranged for different design assemblies or different measuring functions. The versatility of adapters of this type is limited by the number of slide-in units that are available.

SUMMARY OF THE INVENTION

The present invention provides an adapter for positioning test pins for measuring electrical signals on printed circuit boards which can be universally adjusted. In the present invention, the test pins are mounted so that they are moveable to any position parallel to the surface of the support and a positioning carrier is provided which can be adjusted in two Cartesian coordinate directions by means of controllable drive devices and which can locate the pins and then move them from their position according to the known coordinates to the desired locations where test pin positions are desirable. The test pins can then be locked in their new positions and brought into contact with the printed circuit board which is mounted on a carrier which moves relative to the test pins to bring the test pins in contact with the board.

The advantages of the invention consist in that only a single adapter is required because any arbitrary number of design assemblies can be tested by the machine of the invention in that the test pins can be located at any desired position.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWINGS

FIG. 2 is a detail view of the circuit board holder and moving mechanism; and

FIG. 3 is a detail sectional view of the pin positioning mechanism of the invention.

DESCRIPTION OF THE PREFERRED EMBODIMENTS

Figure 1:
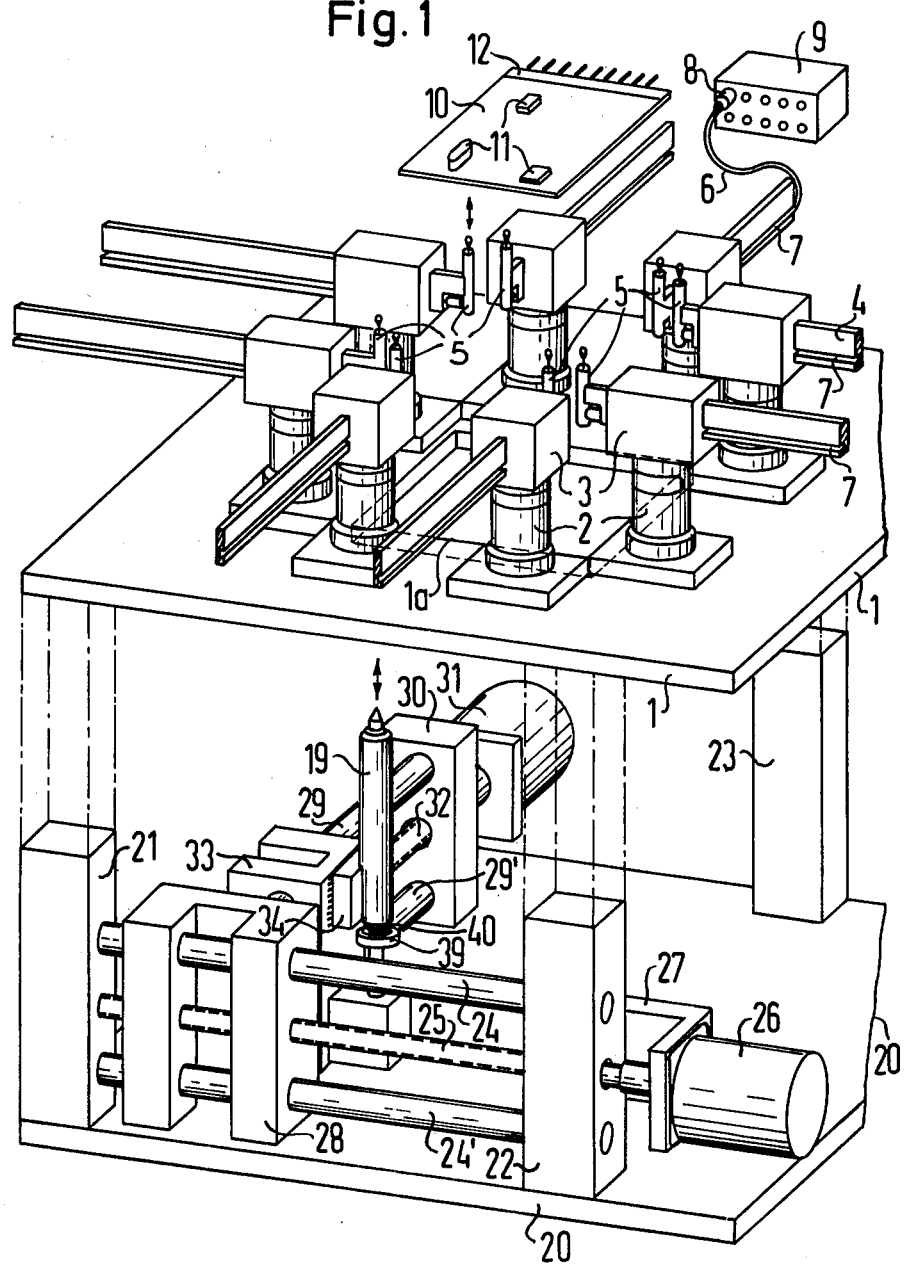
FIG. 1 illustrates the testing machine of the invention.

The testing machine of the invention is illustrated in the Figures and in FIG. 1 a first generally horizontal base plate 1 is formed with an opening 1a. A plurality of test pin contacts 5 are supported on slidable rails 4 which move through blocks 3 that are formed with a suitable groove for receiving the rails therethrough. The blocks 3 are mounted on rotatable column-like bearing members 2 which are mounted on the base plate 1 about the opening 1a as shown. Electrical lines 6 are mounted in grooves 7 formed in the rails 4 and are electrically connected to the contact test pins 5. The other ends of the lines 6 are connected to contact terminals 8 that are receivable in a measuring device which can, for example, record indicate and supply outputs indicative of the signals determined by the test pins 5. For simplicity, the measuring device 9 is illustrated in block form.

As shown in FIG. 1, above the test pins 5, an assembly carrier such as a circuit board upon which might be mounted a plurality of electrical components 11 and which has on its underside, not shown, a plurality of printed circuits which connect the components 11 and to each other and to end terminal contacts that are connected to a plug strip 12.

As shown in FIG. 2, the circuit board 10 is receivable in a U-shape frame member 13 which is formed with a groove 13a into which the printed circuit board is receivable such that the plug strip 12 of the printed circuit board is received in a mating contact strip 14 on the frame 13. In the event measuring and/or operating voltages are not fed to the assembly through the line 6 and the test contacts 5, a cable 15 connects connecting strip 14 to a suitable signal source 16 which might consist of a sub-circuit of a device which is to be tested or might be the measuring circuit device 9.

It is necessary for testing the circuit board 10 that a plurality of terminals or test points which are located on the conductor paths, be electrically connected to the specific line 6 and the terminals 8 of the measuring device 9 through the test pins 5. This is accomplished by moving the test pins according to Cartesian coordinates in a coordinate system which is aligned parallel to the edges of the circuit board 10 and the test pins are moved parallel to the plane of the circuit board 10 until they are at the desired coordinates of the particular points of the circuit on the printed circuit board 10 which are to be contacted by the test points 5. After the test contact points 5 have been positioned as desired, the circuit board 10 and frame 13 are moved downwardly relative to FIGS. 1 and 2 by control rods 17 which are controlled by pneumatic drives 18 mounted on the plate 1 between the members 2 so that the test contacts 5 engage the printed circuit board on the printed circuit board 10 at the desired locations. At this time, of course, the electrical signals at the test points are supplied to conductors 6 to the testing device and after the test signals have been noted, the pneumatic drives allow the frame 13 and the printed circuit board 10 to move upwardly out of engagement with the test probes 5.

The pneumatic drives 18 can be operated by remote control valves and produce the required contact pressure between the test pins 5 and the circuit board 10 without damaging the electrical conductor paths resulting from excess non-uniform or jerky movement of the frame 13. Of course, manual control of the vertical position of the frame 13 in printed circuit board 10 can also be utilized rather than the remote control system.

In order to set the individual test pins to the desired coordinates of the test points to be engaged by the test pins, a vertical moveable carrier device engages the pins and then is moved in two coordinate directions by suitable drive means to be described hereafter to position the pins to the desired position. The pins being mounted on the rails 4 which can slide through the blocks 3 and on the rotating columns 2 which can rotate relative to the base plate 1 allow them to be positioned at any desired point within the opening 1a in which the printed circuit board 10 will be positioned. Locking means 100 and 101 are provided for locking the rail 4 relative to the block 3 and for locking the rotating column 2 relative to the base plate 1. These are unlocked when the pins 5 are to be positioned and are locked when they have been placed in their desired positions.

The setting mechanism for removing the test pins to the desired coordinate test points of the circuit board 10 is accomplished by the carrier 19 which with its drive devices is mounted on a second base plate 20 illustrated in FIG. 1. The base plates 1 and 20 are connected to each other by a spacer frame members 21, 22 and 23. A pair of guide rods 24 and 24' extend between the frame members 21 and 22 and a screw spindle 25 rotatably passes through the frame member 22 and is rotatably mounted in the frame member 21 and is driven by a motor 26 which is connected to frame member 22 by a suitable bracket 27. A U-shaped moving body 28 has two legs which are formed with openings through which the guide rods 24 and 24' extend. The member 28 is also formed with a threaded opening through which the screw spindle 25 is threadedly received such that as the threaded spindle 25 is rotated by the motor 26 the body 28 will move back and forth between the frame members 21 and 22 under the control of the motor 26. Thus, movement of the body 28 moves the body 28 which carries the pin adjusting carrier 19 in a first coordinate direction relative to the printed circuit board 10. Since the printed circuit board is precisely indexed by the frame member 13 and the pneumatic drives 18 which are mounted on the base plate 1, the member 19 can be very precisely indexed in the first coordinate direction by the motor 26 which moves the body 28 and the contact pins 5 can be very accurately positioned in the first coordinate direction by the motor 26.

The center portion of the moving body 28 carries a pair of extending guide rods 29 and 29' which extend at right angles to the guide rods 24 and 24' and point in the direction of the second coordinate. At the ends of the rods 29 and 29' away from the body 28, a frame member 30 is attached to which a second drive motor 31 is mounted by a suitable mounting bracket. The output shaft of the motor 31 is connected to a screw spindle 32 which rotatably passes through the member 30 and is rotatably mounted in member 28. A second U-shaped moving member 33 is slidably mounted on guide rods 29 and 29' as illustrated in FIG. 3 and is formed with a threaded opening through which spindle 32 extends such that when motor 31 rotates the spindle 32 the member 33 will be moved transverse to the guide rods 24 and 24' on the guide rods 29 and 29'. This transverse direction corresponds to the second coordinate direction of the circuit board 10.

Thus, means are provided such that by controlling the motors 26 and 31, the carrier 19 can be positioned to any coordinate position on the printed circuit board 10 in the opening 1a and the carrier 19 is used to position the contact pins 5 to the desired coordinate position on the printed circuit board 10 for testing purposes.

FIG. 3 is a partial sectional view through the carrier 19 which is mounted on a support member 34 connected to moveable member 33. The carrier 19 is hollow and extends through the opening 1a in the base plate 1 and carries a vertically moveable transport pin 36 which is mounted by means of ball bearings 35 in the body of the carrier 19. The transport pin 36 can be displaced in the longitudinal direction or vertically in FIG. 3 as shown by the arrow by means of a driving device 37 which might be an electromagnet which is connected by shaft 37a to the pin 36. In the rest state, the tip of the transport pin 36 is in a position which is lower than the lower ends of the test pins 5 so that when the pin 36 is in the lower position the carrier 19 can be moved to any position without engaging a pin 5. When it is desired to position one of the test pins 5, the carrier 19 is moved to the coordinate position of the test pin 5 and the transport pin 36 is projected to the upper position such that its point upon actuation of device 37 engages into a conical recess 38 formed in the lower end of the test pin 5. A pressure spring 36a abuts against a flange 36b of a drive rod 37a which extends into an opening formed in the transport pin 36 which causes the transport pin 36 to be generally positioned in the conical opening 38 in the test pin 5. After the transport pin 36 has been engaged with the test pin 5 as illustrated in FIG. 3, the carrier 19 can be moved to the proper coordinate position where the test pin is to be transported by moving the test pin 5 and the carrier 19 to the correct coordinate position by actuating motors 26 and 31 at which time the test pin 5 will be at the desired coordinate position of the printed circuit board 10 where a test contact is to be made by the contact point 46 of the test pin 5. The locking means 100 and 101 are unlocked during positioning of the pin 5 and after the pin has been moved to its desired location, the locks or breaking means 100 and 101 are locked so as to lock the rail 4 relative to the lock 3 and the column 2 relative to the plate 1, thus, holding the test pin 5 in the desired coordinate position. Then the transport pin 36 is lowered by de-energization of the driven means 37 freeing the end of the transport pin 36 from the conical recess 38 of the test pin 5 and the carrier 19 then can be moved away from the test pin so as to position other test pins to be used in the test. A compression pressure spring 40 abuts against a flange 39 of the drive rod 37a and maintains the transport pin 36 in the down rest position when the drive means 37 is unenergized.

So as to remove currents and voltages from the test pins in a disturbance free manner, the test pins are designed in a coaxial construction and include an outer conductor 41 and an inner conductor 42 as shown in FIG. 3 with the inner conductor 42 of the test pin connected to the inner conductor 43 of the coaxial line 6. A coaxial connector 44 assures that the line 6 is connected to the pin with the correct surge impedance. A telescoping needle 45 is mounted in the test pin 5 and has a contactor 46 which engages the printed circuit path on the printed circuit board 10. Due to the telescoping action of the needle 45, tolerances of the circuit board which are to be contacted are compensated for.

The coaxial line 6 is supported by an arm 47 which is secured to the rotatable block 3 and the line 6 passes through an end thereof. A tension spring 48 is clamped between the arm 47 and a supporting bolt 49 mounted on the base plate 1 and a spring pulley block 50 which is rotatably mounted on the arm 47 applies spring tension to the rails 4 so as to assure that when the brakes 100 and 101 are unlocked the test pins 5 will move to their initial positions. The locking means 100 and 101 may be electromagnetically operated brakes which when engaged prevent the rail 4 from moving relative to the block 3 and the column 2 from rotating relative to the base plate 1.

The testing machine according to the invention can advantageously be used for measuring a circuit board 10 at a plurality of test points simultaneously by positioning a plurality of test pins 5 in the same manner as has been described with respect to a particular one of the test pins. The machine can also be utilized to spot test and sample a series of individual test points in a successive manner. For this purpose, the test points which are to be located on the circuit board can either be established individually one after another which, for example, could be necessary on the first analysis of an assembly or alternatively can be located completely automatically by means of an appropriate program control of the motors 26 and 31 as, for example, when a plurality of circuit boards of the same kind are being tested.

Although the invention has been described with respect to preferred embodiments, it is not to be so limited, as changes and modifications may be made which are within the full intended scope as defined by the appended claims.

I claim as my invention:

1. A machine for testing a plurality of terminal and/or test points of an assembly arranged on a support to a measuring circuit through at least one test pin, wherein said test pins (5) are arranged to be movable approximately parallel to the surface of said support (10), a carrier (19) moveable in two coordinate directions, a pair of controllable drive devices (26, 31) connected to move said carrier to located said test pins (5) when these are in the rest position and to individually engage one of said test pins and transport it to a desired coordinate location of the terminal or test points which are to be contacted, and that contacting is effected by virtue of relative movement between the test pins (5) and said support (10).

2. A machine for testing according to claim 1 including a base plate and wherein said test pins (5) are secured to rails (4), which are longitudinally displaceably mounted in rotatable blocks (3) mounted on said base plate.

3. A machine according to claim 2, a first moveable body (28) mounted so as to be driven with a first screw spindle (25) relative to said base plate in the direction of a first coordinate, and said first moveable body moves on first guide rods (24), and said first moveable body carries second guide rods (29) which are arranged in the direction of a second coordinate, and a second moveable body (33) which is driven with a second screw spindle (32) and on which said carrier (19) is mounted.

4. A machine according to claim 3 wherein said carrier (19) includes a longitudinally displaceable transport pin (36) which ends in a point and which is engageable with centering recesses (38) formed in said test pins (5).

5. A machine according to claim 4 wherein said rails (4) for the test pins (5) are provided with longitudinal grooves (7) which accommodate electrical lines (6) which connect to a measuring circuit (9).

6. A machine according to claim 5 wherein said rotatable blocks (3) are mounted on the side of said base plate (1) which faces towards the support (10), and said first and second guide rods (24,29) are mounted on the opposite side, and said carrier (19) which can move along the guide rods (24, 29) engages said test pins through a recess (1a), corresponding to the coordinate range which can be covered formed in the base plate (1).

7. A machine according to claim 6 wherein a pair of remote-controlled drive means (26, 31) are provided which have their output shafts coupled to said screw spindles (25, 32) either to execute rotating steps of given magnitude in dependence upon an adjustable number of timing pulses, or to execute a continuous rotating movement in dependence upon control pulses of adjustable duration.

8. A machine according to claim 7 wherein said of said test pins (5) is of coaxial construction, and possesses a hollow inner conductor (42) into which a needle (45) is mounted and with a contact body (46) at its end and said needle is spring-mounted in the longitudinal direction.

9. A machine according to claim 8 wherein springs (48, 50) are provided, which act upon the rails (4) to move the test pins (5), and return the latter to their rest positions on the completion of measurements.

10. A machine according to claim 9 including electromagnet brake means which prevent further rotating movements of said blocks (3) and longitudinal displacements of said rails (4) as soon as the test pins (5) have reached their desired test positions.

* * * * *